(12) United States Patent
Bordere et al.

(10) Patent No.: US 7,799,246 B2
(45) Date of Patent: *Sep. 21, 2010

(54) METHOD FOR SYNTHESIS OF CARBON NANOTUBES

(75) Inventors: Serge Bordere, Jurancon (FR); Daniel Cochard, Argagnon (FR); Eric Dutilh, Cescau (FR); Patrice Gaillard, Hagetaubin (FR); Dominique Plee, Lons (FR)

(73) Assignee: Arkema France, Colombes (FR)

( * ) Notice: Subject to any disclaimer, the term of this patent is extended or adjusted under 35 U.S.C. 154(b) by 122 days.

This patent is subject to a terminal disclaimer.

(21) Appl. No.: 11/814,811

(22) PCT Filed: Feb. 3, 2006

(86) PCT No.: PCT/FR2006/000250

§ 371 (c)(1),
(2), (4) Date: Jul. 26, 2007

(87) PCT Pub. No.: WO2006/082325

PCT Pub. Date: Aug. 10, 2006

(65) Prior Publication Data

US 2008/0135816 A1 Jun. 12, 2008

Related U.S. Application Data

(60) Provisional application No. 60/729,650, filed on Oct. 24, 2005.

(30) Foreign Application Priority Data

Feb. 7, 2005 (FR) .................................. 05 01197
Oct. 20, 2005 (FR) .................................. 05 10699

(51) Int. Cl.
*H01B 1/04* (2006.01)
*C01B 31/02* (2006.01)

(52) U.S. Cl. ................... 252/502; 252/510; 252/511; 423/461; 423/447.2; 423/447.1; 423/445 B; 502/182; 502/185

(58) Field of Classification Search ............. 252/502, 252/510, 511; 502/182, 185; 423/461, 447.2, 423/447.1, 445 B
See application file for complete search history.

(56) References Cited

U.S. PATENT DOCUMENTS 4,663,230 A  5/1987  Tennent

| | | | |
|---|---|---|---|
| 6,423,288 B2 | 7/2002 | Mandeville et al. | |
| 6,919,064 B2 * | 7/2005 | Resasco et al. | 423/447.3 |
| 7,157,068 B2 | 1/2007 | Li et al. | |
| 2004/0000697 A1 * | 1/2004 | Setoguchi et al. | 257/432 |
| 2004/0151654 A1 | 8/2004 | Wei et al. | |
| 2005/0002851 A1 * | 1/2005 | McElrath et al. | 423/447.3 |
| 2005/0074392 A1 * | 4/2005 | Yang et al. | 423/447.3 |
| 2006/0133982 A1 * | 6/2006 | Kinloch et al. | 423/447.3 |
| 2006/0257310 A1 * | 11/2006 | Tada et al. | 423/447.3 |
| 2008/0193367 A1 * | 8/2008 | Kalck et al. | 423/447.1 |
| 2009/0286675 A1 * | 11/2009 | Wei et al. | 502/184 |
| 2009/0291846 A1 * | 11/2009 | Resasco et al. | 502/185 |

FOREIGN PATENT DOCUMENTS

| FR | 2 826 596 | 10/2001 |
|---|---|---|
| WO | WO 87/07559 | 12/1987 |
| WO | WO 2006008385 A1 * | 1/2006 |

OTHER PUBLICATIONS

Derwent (TM) Abstract of FR 2826596, Jan. 3, 2003.*
Yu, Z. et al., "Effect of Catalyst Preparation on the Carbon ZNanotube Growth Rate", Catalyst Today, 100, 2005, pp. 261-267.
Mauron, P. et al: "Fluidised-bed CVD Synthesis of Carbon Nanotubes on Fe2O3/MgO", Diamond and Related Materials, Elsevier Science Publishers, Amsterdam, NL, vol. 12, No. 3-7, Mar. 2003, pp. 780-785.
Corrias, M. et al., "Carbon Nanotubes Produced by Fluidized bed catalytic CVD: First Approach of the Process", Chemical Engineering Science, Oxford, GB, vol. 58, No. 19, Oct. 2003, pp. 4475-4482.
Fazle Kibria A K M et al: "Synthesis of narrow-diameter carbon nanotubes from acetylene decomposition over an iron-nickel catalyst supported on alumina", Carbon, vol. 40, No. 8, Jul. 2002, pp. 1241-1247.
Yu, Z. et al, "Catalytic engineering of carbon nanotube production", Applied Catalysis A: General, Elsevier Science, Amsterdam, NL, vol. 279, No. 1-2, Jan. 28, 2005, pp. 223-233.
Perez-Cabero M. et al., Syntheses of CNTs over several iron-supported catalysts: influence of the metallic precursors: Catalysis Today, Elsevier, vol. 93-95, Sep. 1, 2004, pp. 681-687.
Navarro Lopez, P. et al, "A study of carbon nanotube formation by C2H2 decomposition on an iron based catalyst using a pulsed method", Carbon, vol. 41, No. 13, 2003, pp. 2509-2517.

* cited by examiner

*Primary Examiner*—Douglas Mc Ginty
(74) *Attorney, Agent, or Firm*—Steven D. Boyd

(57) ABSTRACT

The present invention relates to a process for preparing CNTs by bringing a carbon source into contact with a multivalent metal and/or metal-oxide-based catalyst deposited on an inorganic substrate having a BET specific surface area of greater than 50 m²/g. The CNTs obtained may be used as agents for improving the mechanical and electrical conductivity properties in polymeric compositions.

14 Claims, No Drawings

METHOD FOR SYNTHESIS OF CARBON NANOTUBES

Field of the Invention

The subject of the present invention is a process for synthesizing carbon nanotubes (CNTs) in a gas phase in the presence of a metal catalyst supported by a specific inorganic substrate.

PRIOR ART

Carbon nanotubes are recognized at the present time as being materials having great advantages because of their mechanical properties, their very high form factors (length/diameter ratios) and their electrical properties.

They are made up from graphite sheets that are wound up and terminated by hemispheres consisting of pentagons and hexagons with a structure similar to fullerenes.

Nanotubes are known to be composed of either a single sheet—referred to as single-walled nanotubes (SWNTs)—or of several concentric sheets—called multi-walled nanotubes (MWNTs). In general, SWNTs are more difficult to manufacture than MWNTs.

Carbon nanotubes may be produced by various processes, such as electrical discharge, laser ablation or chemical vapour deposition (CVD).

Among these techniques, the latter one seems to be the only one capable of manufacturing carbon nanotubes in large quantity, an essential condition for achieving a cost price allowing them to be used in bulk in polymer and resin applications.

In this method, a carbon source is injected at a relatively high temperature onto a catalyst, the said catalyst possibly consisting of a metal supported on an inorganic solid. Among metals, preferably cited are iron, cobalt, nickel and molybdenum, and among supports alumina, silica and magnesia are often found.

The carbon sources that may be envisaged are methane, ethane, ethylene, acetylene, ethanol, methanol, acetone, or even $CO/H_2$ synthesis gas (the HIPCO process).

Among the documents disclosing the synthesis of carbon nanotubes, mention may be made of WO 86/03455A1 from Hyperion Catalysis International Inc. corresponding to EP 225 556 B1, which may be considered as one of the basic patents regarding the synthesis of CNTs, which claims carbon fibrils (the old name for CNTs) that are almost cylindrical, the diameter of which is between 3.5 and 70 nm, the form factor being equal to 100 or higher, and also the process for preparing them.

The synthesis is carried out by bringing a catalyst containing iron (for example $Fe_3O_4$, Fe on a carbon support, Fe on an alumina support or Fe on a carbon fibril support) into contact with a carbon-containing gaseous compound (preferably CO or one or more hydrocarbons), advantageously in the presence of a compound capable of reacting with carbon in order to produce gaseous products (for eample CO, $H_2$ or $H_2O$). In the examples, the catalysts are prepared by dry impregnation, by precipitation or by wet impregnation.

WO 87/07559 corresponding to EP 270 666 B1 of the same Applicant claims a process for manufacturing fibrils with a diameter of between 3.5 and 70 nm but with a form factor L/D of between 5 and 100 from the same reactants and catalysts.

No information about the productivity (which would be expressed as the mass of fibrils formed per gram of catalyst and per unit time) is given, except the fact that it is necessary, if the carbon-containing gaseous compound is benzene, to work at above 800° C.

Other documents claim process improvements, such as the continuous fluidized bed that allows the state of aggregation of the catalyst and of the carbon materials formed to be controlled (see for example WO 02/94713 A1 in the name of Tsinghua University) or improvements in products, such as WO 02/095097 A1 in the name of Trustees of Boston College, which prepares non-aligned nanotubes of various morphologies by varying the nature of the catalyst and the reaction conditions.

US 2001/0036549 A1 from Hyperion Catalysis International Inc. discloses an improved process for preparing CNTs by decomposition of a carbon source in contact with a multivalent transition metal or, preferably, a mixture of metals (such as Fe and M0, Cr, Mn and/or Ce), the improvement in which consists of the fact that the transition metal, which forms a multiplicity of catalytic sites varying in size between 3.5 and 70 nm, is supported by an inorganic substrate having a size of less than 400 μm.

In the examples, the carbon source is a hydrogen/ethylene mixture, the respective partial pressures of which are 0.66 and 0.33, the reaction time at 650° C. is 30 minutes and the catalyst is prepared by impregnating a pyrolytic alumina (iron content not given, but estimated to be 15%) with iron nitrate in the presence of methanol in an amount sufficient to obtain a paste. The productivity is 6.9 g/g in 30 minutes, while it reaches between 10.9 and 11.8 g/g when a molybdenum salt is added, for iron contents of around 9 to 10% and molybdenum contents of 1 to 2%.

When the co-metal is cerium, chromium or manganese, the nanotube productivity is 8.3, 9.7 and 11, respectively.

It has also been found that iron acetylacetonate is less effective than iron nitrate.

In Example 16, the impregnation is carried out in aqueous phase by precipitation at a pH of about 6 by simultaneously adding iron nitrate and sodium bicarbonate solutions. The catalyst results in a selectivity of 10.5 for a 15% iron content and semicontinuous introduction into the reactor.

Another example, by impregnation in aqueous phase of iron and molybdenum, gives results as good as with methanol.

That document also shows that replacing iron with molybdenum at Mo contents of greater than 2.5% is somewhat unfavourable since a productivity of 8.8 g/g is achieved in 30 minutes for a mixture containing equal proportions of Fe and Mo (total=16.7%).

When a non-porous support, such as Degussa pyrolytic alumina used by Hyperion, with a specific surface area of 100 m²/g, is used, it is found to be difficult to impregnate large quantities of iron as only the external layer is accessible to the gas and the lower layers will exhibit insufficient catalytic activity.

Moreover, the technique using this kind of support is complicated since the particle size is 20 nm and the bulk density is 0.06, which increases the difficulty of industrial implementation.

Detailed Description of the Invention

The subject of the present invention is a process for synthesizing CNTs by decomposition of a carbon source that is brought into contact in a reactor, preferably a fluidized-bed reactor, at a temperature of between 500 and 1,500° C., with one or more multivalent transition metals with a zero oxidation state and/or in oxide form (positive oxidate state) and recovery of the said CNTs, characterized in that the transition metal or metals and/or their oxide(s) are supported on a substrate with a BET specific surface area of greater than 50 m$^2$/g and preferably between 70 m$^2$/g and 300 m$^2$/g; among supports, mention may preferably be made of inorganic supports, and advantageously gamma-type or theta-type aluminas.

According to a preferred embodiment, the supports are capable of being impregnated with an amount of transition metal(s) and/or of transition metal oxide(s) such that the weight of transition metal(s) may represent up to 50% by weight of the final catalyst, advantageously from 15 to 50% and preferably from 30 to 40% of the weight of the final catalyst.

The size of the particles of the support is advantageously chosen so as to allow good fluidization of the catalyst during the CNT synthesis reaction. In practice, to ensure acceptable productivity, it is preferred that the support particles have a diameter ranging widely between about 20 μm and about 500 μm. Of course, it would not be outside the scope of the invention if the size of the support particles were to be outside the abovementioned limits.

Advantageously, the impregnation of the support particles is carried out in a stream of dry gas, for example by means of an aqueous iron nitrate solution when the transition metal is iron, at a temperature between room temperature and the boiling point of the solution. The amount of impregnation solution is chosen so that, at any moment, the support particles are in contact with an amount of solution just sufficient to ensure formation of a surface film on the said support particles.

The fact of working "dry", that is to say having at any moment just the amount of liquid needed to create a liquid film on the surface of the catalytic support particles, is an advantage as it makes it possible, by heating in a stream of dry air, to prevent any aqueous discharge (for example aqueous discharge of nitrates when the impregnation solution contains iron nitrate; after impregnation, the product obtained is heated to 300° C. in an inert or non-inert gas in order to remove the nitrates).

According to a preferred embodiment, the reduction of the catalyst takes place in situ in the synthesis reactor, advantageously a fluidized-bed reactor, and the catalyst does not see air again, and thus the transition metal(s), preferably iron, remains in metal form.

In the case of continuous CNT synthesis with a catalyst in the form of one or more metal oxides, preferably in the form of iron oxide, the catalyst may be injected directly into the reaction mixture without passing via a reduction step. Advantageously, this avoids having to install a reduction reactor and/or to store the catalyst in reduced form which ought to be effected in an inert gas.

The carbon source may be chosen from any type of carbon-containing material, such as methane, ethane, propane, butane, another, higher, aliphatic alkane, benzene, cyclohexane, ethylene, propylene, butene, isobutene, another, higher, aliphatic alkene, toluene, xylene, cumene, ethyl benzene, naphthalene, phenanthrene, anthracene, acetylene, a higher alkyne, formaldehyde, acetaldehyde, acetone, methanol, ethanol, carbon monoxide, etc., by themselves or as a mixture.

The CNTs obtained according to the process described above can be used in many fields, especially in electronics (depending on the temperature and their structure, they may be conductors, semiconductors or insulators), in mechanical applications, for example for the reinforcement of composites (the CNTs are one hundred times stronger and six times lighter than steel) and in electromechanical applications (they can elongate or contract by charge injection). For example, mention may be made of the use of CNTs in macromolecular compositions intended for example for the packaging of electronic components, for the manufacture of fuel lines, antistatic coatings, in thermistors, electrodes for supercapacitors, etc.

EXAMPLE 1

A catalyst was prepared from Puralox NWA 155 gamma-alumina, at least 5% by weight of the particles of which were less than 100 μm and at least 2% were greater than 500 μm and the median diameter of which was around 250 μm. The surface area and porosity characteristics are given below:

| | |
|---|---|
| BET surface area (m$^2$/g) | 154 |
| Total pore volume (cm$^3$/g) | 0.45 (pores from 0 to 200 nm measured by DFT) |
| Micropore volume (cm$^3$/g) | 0.005 (pores from 0 to 2 nm measured by t-plot) |

300 g of alumina were introduced into a jacketed 3 litre reactor heated to 100° C. and swept with air. By means of a pump, 700 ml of an iron solution containing 545 g/l of iron nitrate nonahydrate were then continuously injected. The duration of iron solution addition was 10 h and the rate of addition of the liquid was equal to the rate of evaporation of the water, the intended (metal mass/catalyst mass) ratio being 15%.

The catalyst was then left at 100° C. in an oven for 16 h.

EXAMPLE 2

A catalyst was prepared from Puralox SCCA 5-150 gamma-alumina having a median diameter of about 85 μm.

The surface area and porosity characteristics are given below:

| | |
|---|---|
| BET surface area (m$^2$/g) | 148 |
| Total pore volume (cm$^3$/g) | 0.47 (pores from 0 to 200 nm measured by DFT) |
| Micropore volume (cm$^3$/g) | 0.0036 (pores from 0 to 2 nm measured by t-plot) |

The catalyst preparation and the impregnation were carried out in the same way as in Example 1.

EXAMPLE 3

A catalyst was prepared with 25% iron by impregnation under conditions similar to those of Example 2 with the same SCCA 5-150 alumina. The duration of addition and the volume of solution were simply adjusted pro rata with the iron content that it was desired to set, i.e. 16 h.

The catalyst was then left at 100° C. in an oven for 16 h.

EXAMPLE 4

A catalyst containing 35% iron by impregnation of the SCCA 5-150 alumina was prepared. The duration of addition and the volume of solution were simply adjusted pro rata with the iron content that it was desired to set, i.e. 23 h.

The catalyst was then left at 100° C. in an oven for 16 h.

EXAMPLE 5

A catalyst containing 50% iron by impregnation of the SCCA 5-150 alumina was prepared. The duration of addition and the volume of solution were simply adjusted pro rata with the iron content that it was desired to set, i.e. 32 h.

The catalyst was left at 100° C. in an oven for 16 h.

EXAMPLE 6

A catalyst was prepared from Engelhard C 500-511 gamma-alumina having a median diameter of 150 μm. The surface area and porosity characteristics are given below:

| | |
|---|---|
| BET surface area (m²/g) | 206 |
| Total pore volume (cm³/g) | 0.48 (pores from 0 to 200 nm measured by DFT) |
| Micropore volume (cm³/g) | 0 (pores from 0 to 2 nm measured by t-plot) |

A catalyst containing 25% iron was prepared using the conditions of Example 3. The catalyst was left at 100° C. for 16 h.

EXAMPLE 7

A catalyst was prepared from Engelhard C 500-512 theta-alumina having a median diameter of 70 μm.

The surface area and porosity characteristics are indicated below:

| | |
|---|---|
| BET surface area (m²/g) | 93 |
| Total pore volume (cm³/g) | 0.37 (pores from 0 to 200 nm measured by DFT) |
| Micropore volume (cm³/g) | 0.003 (pores from 0 to 2 nm measured by t-plot) |

A catalyst containing 25% iron by impregnation was prepared under the same conditions as in Example 3.

EXAMPLE 8

A catalytic test was carried out by placing a mass of about 150 g of catalyst as a layer in a reactor 25 cm in diameter and 1 m in effective height, fitted with a disengagement intended to prevent the entrainment of fine particles towards the downstream. The solid was heated to 300° C. in nitrogen in order to decompose the nitrates, and then the temperature was raised to 650° C. in a hydrogen/nitrogen (20%/80% vol./vol.) mixture. At this temperature, a flow of ethylene at 3000 Sl/h and a flow of hydrogen at 1000 Sl/h were introduced, corresponding to an ethylene partial pressure of 0.75.

The gas flow rate was sufficient for the solid to be well above the limiting fluidization velocity, while still remaining below the fly-off velocity.

After 60 minutes the heating was stopped and the resulting quantity of product formed was evaluated. At the same time, the quality of the nanotubes produced was estimated by microscopy (type of CNT formed: SWNT or MWNT; Ø; presence of other forms of C).

The results are given in the table below:

| Catalyst of example | Productivity | Type of CNT formed |
|---|---|---|
| 1 | 6.6 | MWNT/Ø: 10-30 nm, no other forms of C |
| 2 | 8 | MWNT/Ø: 10-30 nm, no other forms of C |
| 3 | 11.4 | MWNT/Ø: 10-30 nm, no other forms of C |
| 4 | 20 | MWNT/Ø: 10-30 nm, no other forms of C |
| 5 | 15 | MWNT/Ø: 10-30 nm, no other forms of C |
| 6 | 10 | MWNT/Ø: 10-30 nm, no other forms of C |
| 7 | 9 | MWNT/Ø: 10-30 nm, no other forms of C |

For comparison, Example 10 from US 2001/0036549 describes the synthesis of CNTs from a hydrogen/ethylene mixture in contact with a catalyst containing 12% iron prepared from pyrolytic alumina impregnated with iron nitrate. The CNT productivity was 5.5 for a catalyst in 30 minutes.

EXAMPLE 9

A catalyst prepared as in Example 4 was introduced into a reactor according to Example 8 and heated to 300° C. in order to decompose the nitrates. The reactor was then cooled and the catalyst recovered in air. This catalyst, which had not undergone a reduction step, and therefore was in iron oxide form, was then reintroduced into the reactor heated to 650° C. as in Example 8 directly in an ethylene/hydrogen stream at an ethylene partial pressure of 0.8. After 60 minutes of reaction, the heating was stopped and the resulting quantity and quality of the product formed were evaluated. A productivity of 14.6 was obtained, similar to the results obtained with a reduced catalyst; the CNTs formed were of the MWNT type (Ø=10-30 nm) and contained no other forms of carbon.

The invention claimed is:

1. Process for synthesizing CNTs by decomposition of a carbon source that is brought into contact in a fluidized-bed reactor, at a temperature of between 500 and 1,500° C., with one or more multivalent transition metals with a zero and/or positive oxidation state and recovery of the said CNTs, characterized in that:
   said one or more multivalent transition metals is supported on a substrate with a BET specific surface area of between 70 m²/g and 300 m²/g, and
   the quantity of said one or more multivalent transition metals represents from 15 to 50% of the weight of the final catalyst.

2. Process according to claim 1, characterized in that the quantity of transition metals represents from 30 to 40% of the weight of the final catalyst.

3. Process according to claim 1, characterized in that the catalyst comprises particles have a diameter between about 20 μm and 500 μm.

4. Process according to claim 1, characterized in that the catalyst is prepared by impregnating the substrate with an impregnation solution containing at least one salt of said one or more transition metals.

5. Process according to claim 4, characterized in that the said catalyst is prepared by impregnating the substrate by means of an aqueous iron nitrate solution, and in that the quantity of liquid, at any moment, in contact with the substrate is just sufficient to ensure formation of a surface film on the substrate.

6. Process according to claim 4, characterized in that the catalyst is reduced in situ and the catalyst and is not exposed to air.

7. Process according to claim 6, characterized in that it is continuous.

8. Process according to claim 4, characterized in that the catalyst is based on one or more metal oxides.

9. Process according to claim 8, characterized in that it is continuous.

10. Process of claim 1, characterized in that said substrate is an inorganic support.

11. Process of claim 1, characterized in that said substrate is selected from gamma-type aluminas or theta-type aluminas.

12. Process of claim 5, characterized in that said nitrate solution is at a temperature between room temperature and the boiling point of the impregnation solution.

13. Process according to claim 6, characterized in that the catalyst is based on iron.

14. Process according to claim 8, characterized in that the one or more metal oxides is iron oxide.

\* \* \* \* \*